United States Patent [19]

Oishi et al.

[11] Patent Number: 5,310,707
[45] Date of Patent: May 10, 1994

[54] SUBSTRATE MATERIAL FOR THE PREPARATION OF OXIDE SUPERCONDUCTORS

[75] Inventors: Akira Oishi; Toshio Usui; Hidekazu Teshima; Tadataka Morishita, all of Tokyo, Japan

[73] Assignee: Superconductivity Research Laboratory International, Tokyo, Japan

[21] Appl. No.: 952,212

[22] Filed: Sep. 28, 1992

Related U.S. Application Data

[63] Continuation-in-part of Ser. No. 675,801, Mar. 27, 1991, abandoned.

[30] Foreign Application Priority Data

Mar. 28, 1990 [JP] Japan ................. 2-82498

[51] Int. Cl.$^5$ ............................. C04B 35/50
[52] U.S. Cl. ..................... 501/126; 501/152; 423/593
[58] Field of Search ............ 501/152, 86, 126; 515/1; 252/521; 423/593

[56] References Cited

U.S. PATENT DOCUMENTS 4,962,086 10/1990 Gallagher et al. ............ 505/1
4,962,087 10/1990 Belt et al. .................... 505/1

FOREIGN PATENT DOCUMENTS 0345441 12/1989 European Pat. Off. .
3906499 11/1989 Fed. Rep. of Germany .
9004857 5/1990 World Int. Prop. O. .

OTHER PUBLICATIONS

Acta Cryst., 1957, 10, 248.
Dai 37 Kai Oyobutsurigaku Kanren Rengo Kouenkai Apr. 1990, vol. 1, JSAP, (Spring Meeting).
Nikkei Superconductors Apr. 16, 1990.
Physica C, vol. 162–164, 1989, pp. 703–704.
Appl. Phys. Lett. 55 (21), 1989, pp. 2230–2232.
J. Mater. Res., vol. 5, No. 1, 1990, pp. 183–189.
J. crystal Growth 109, 1991, pp. 457–466.

Primary Examiner—Mark L. Bell
Assistant Examiner—C. M. Bonner
Attorney, Agent, or Firm—Jacobson, Price, Holman & Stern

[57] ABSTRACT

A substrate material for the preparation of an oxide superconductor includes two different rare earth elements A' and A" in the IIIa group, Ga, and 0, the atomic ratio of these elements being expressed as $A'_{1-x}A''_xGaO_3$ (where $0 < x < 1$), and a mixed crystal material forming a perovskite-type structure having a composition of $AGaO_3$ with A being at least one of the two rare earth elements A' and A" in the IIIa group, a substrate material for preparing an oxide superconductor includes a mixed crystal material made up of Nd, La, Ga, and O in an atomic ratio of $La_{1-x}Nd_xGaO_3$ wherein $0.2 \leq x < 1.0$, the substrate material forming a $GdFeO_3$-type structure; a substrate material for preparing an oxide superconductor includes a mixed material made up of Nd, $A^1$, Ga, and O in an atomic ratio of $A^1_{1-x}Nd_xGaO_3$ where $A^1$ is a rare earth element excluding La and Nd, and $0.2 \leq x < 1.0$, the mixed crystal material forming a $GdFeO_3$-type structure. A method for the preparation of the oxide superconductor, or a semiconductor, includes forming an intermediate layer of a mixed crystal material of two different rare earth elements A' and A" in the IIIa group, Ga, and O. The atomic ratio of these elements is expressed as $A'_{1-x}A''_xGaO_3$ (where $0 < x < 1$) and the mixed crystal material has a perovskite-type structure whose composition is $AGaO_3$ with A being at least one of the two rare earth elements A' and A" in the IIIa group.

1 Claim, 4 Drawing Sheets

SUBSTRATE MATERIAL FOR THE PREPARATION OF OXIDE SUPERCONDUCTORS

This is a Continuation-in-Part of application Ser. No. 07/675,801, filed Mar. 27, 1991 which was abandoned upon the filing hereof.

BACKGROUND OF THE INVENTION

The present invention relates to a substrate material and a method for separating oxide superconductors. More specifically, it relates to a substrate material for preparing a superior oxide superconductor film (either thick or thin), a material for an intermediate layer, or a substrate insulator for silicon on insulator (abbreviated as S.O.I.). More broadly, it relates to techniques useful when applied to the field of electronics including devices using Josephson junction as well as that of electric power including power storage and power transmission.

Various methods have been known for the manufacture of oxide superconductors, including a method of depositing a film using epitaxial growth of an oxide superconductor on a substrate. Also, various methods are known for forming films, such as molecular beam epitaxy (abbreviated as M.B.E.) and high-frequency spattering. An atmosphere in which a film is formed almost always includes oxygen. When a film of an oxide superconductor is formed according to these methods, a substrate material is required that does not react with the oxide superconductor. As substrate materials satisfying this condition, MgO, $ZrO_2$, $MgAl_2O_4$, $LaAlO_3$, $SrTiO_3$, $LaGaO_3$, etc. are used. These materials are less reactive with oxide superconductors than Si or $Al_2O_3$.

However, according to studies having been done so far in the field of superconductivity, it is known that substrate materials such as $SrTiO_3$ and $LaGaO_3$ show superior superconducting characteristics compared to MgO, $ZrO_2$, $MgAl_2O_4$, or $LaAlO_3$ when they are used in devices.

Table 1 shows the lattice constants of the substrate materials and the oxide superconductors mentioned above, and Si and GaAs. In Table 1, the values of lattice constants of $SrTiO_3$ and $YBa_2Cu_3O_y$ (y being approximately 7) shown with the "*" mark attached are those multiplied by the square root of 2 so as to emphasize lattice mismatching. As readily seen from Table 1, $SrTiO_3$, $LaGaO_3$ and the like have smaller mismatching of lattice constants with the oxide superconductors. The smaller the differences are in lattice constants between the substrate materials and the oxide superconductors, the easier the epitaxial growth becomes, so as to make it easy to obtain an oxide superconductor film of single crystal and thus improve the superconducting characteristics of the oxide superconductors in a film form.

As materials having smaller mismatching with oxide superconductors, perovskite-type compounds such as $LaGaO_3$ have been used. FIG. 3 shows the unit crystal structure of $LaGaO_3$ and an oxide superconductor $YBa_2Cu_3O_y$. It should be noted that oxygen is not shown in FIG. 3. As shown in FIG. 3, many compounds of perovskite type are known to have lattice constants close to a multiple of the lattice constants of oxide superconductors or to 2n times the multiple (n being an integer).

The inventors of the present invention have studied the state of prior art described above and found the following problems.

The lattice constants of an oxide superconductor film prepared by M.B.E. or high-frequency spattering described above vary depending on the concentration of oxygen in the atmosphere during film formation or in a cooling process.

Also, the temperature during the formation of an oxide superconductor film by M.B.E. or high-frequency spattering is normally as high as 600° C. to 800° C. Therefore, there exits mismatching between a substrate material and an oxide superconductor caused by differences in the thermal expansion of the materials. As a result, because of the mismatching due to thermal expansion as well as that due to differences in the lattice constants, an oxide superconductor with superior superconducting characteristics cannot be obtained when the conventional substrate materials described above are used.

Furthermore, in order to obtain a device in which oxide superconductor and semiconductor elements coexist, an oxide superconductor film has to be prepared on, for example, an Si substrate. However, when a film of an oxide superconductor is prepared by the M.B.E. or the high-frequency spattering mentioned above, because the temperature of film formation is high, the oxide superconductor and the Si substrate react with each other, and the superconducting characteristics of the oxide superconductor may never materialize.

Also, an article entitled Thermal Analysis of Rare Earth Gallates and Aluminates (H. M. O'Bryan et al., J. Mater. Res., vol. 5, No. 1, pp. 183-189) discloses the fact that $LaGaO_3$ crystal undergoes a phase transition between orthorhombic and rhombohedral structures at a temperature of about 145° C. (see FIGS. 1 and 2, and the last paragraph on page 184) and that $NdGaO_3$ crystal is orthorhombic from 25° C. and up to 1000° C. (see Table 1).

BRIEF SUMMARY OF THE INVENTION

The present invention has been made to solve the above-mentioned problems.

An object of the present invention is, in respect of a substrate material used in the preparation of an oxide superconductor, to provide a technology which makes it possible to improve the superconducting characteristics of an oxide superconductor prepared on such a substrate material.

Another object of the present invention is, in respect of preparing a semiconductor on a substrate material, to provide a technology which makes it possible to prepare a good semiconductor on the substrate material.

Still another object of the present invention is, in respect of preparing a semiconductor on an oxide superconductor with an intermediate layer between them, to provide a technology which makes it possible to improve the superconducting characteristics of the oxide superconductor.

Yet another object of the present invention is, in respect of preparing a semiconductor on an oxide superconductor with an intermediate layer between them, to provide a technology which makes it possible to prepare a good semiconductor on the intermediate layer.

The above-mentioned objects and other objects as well as the novel characteristics of the present invention will be made clear by the disclosure of this specification and the attached drawings.

In order to achieve the objects described above, the substrate material for the preparation of an oxide superconductor of the present invention is characterized by comprising two different rare earth elements A' and A" in the IIIa group, Ga, and O, the atomic ratio of these elements being expressed as A'$_{1-x}$A"$_x$GaO$_3$ (where $0<x<1$), and by comprising a mixed crystal material forming a perovskite-type structure having a composition of AGaO$_3$ with A being at least one of the two rare earth elements A' and A" in the IIIa group.

The present invention is also characterized by the preparation of a semiconductor on the substrate material.

In addition, the present invention is characterized by the formation of an intermediate layer of a mixed crystal material comprising two different rare earth elements A' and A" in the IIIa group, Ga, and O, the atomic ratio of these elements being expressed as A'$_{1-x}$A"GaO$_3$ (where $0<x<1$), and the mixed crystal material being characterized to form a perovskite-type structure having a composition of AGaO$_3$ with A being at least one of the two rare earth elements A' and A" in the IIIa group.

Furthermore, the present invention is characterized by the formation of an intermediate layer of a mixed crystal material which comprises two different rare earth elements A' and A" in the IIIa group, Ga, and O, the atomic ratio of these elements being expressed as A'$_{1-x}$A"GaO$_3$ (where $0<x<1$), and which mixed crystal material forms a perovskite-type structure having a composition of AGaO$_3$ with A being at least one of the two rare earth elements A' and A" in the IIIa group, and by the preparation of a semiconductor on the intermediate layer.

According to these characteristics of the present invention as summarized above, because it appears that the rare earth elements in the IIIa group at the La sites in FIG. 3 have similar characters and can be replaced by a different rare earth element in the IIIa group with a different ionic radius, a substrate material with differing lattice constants can be obtained while maintaining its crystal structure. Therefore, the lattice constants which are normally inherent to a material can be varied artificially so as to reduce the mismatching between an oxide superconductor and a substrate material due to differences among their lattice constants and improve the superconducting characteristics of an oxide superconductor.

Also, it is possible to choose the lattice constants of a substrate material for the preparation of an oxide superconductor while taking thermal expansion into consideration so as to reduce mismatching between an oxide superconductor and a substrate material even under the high temperature conditions for the formation of an oxide superconductor film by M.B.E. or by high-frequency spattering. Thus an oxide superconductor with superior superconducting characteristics can be prepared.

Further, because certain multiples of the lattice constants of a unit cell of the substrate materials or the multiple times the square root of 2 are close to the lattice constants of Si and GaAs, by forming an insulator substrate for S.O.I. using the substrate material mentioned above, a good film of Si or GaAs can be formed on the insulator layer.

In addition, by forming an intermediate layer of the above-described substrate material between an oxide superconductor and an Si or GaAs substrate, the superconducting characteristics of the oxide superconductor prepared on the intermediate layer can be improved.

Also, because the substrate material exists between an oxide superconductor and a semiconductor substrate, even under the high temperature conditions for the formation of an oxide superconductor film by M.B.E. or by high-frequency spattering, the oxide superconductor film and the Si substrate will not react with each other, and the resulting oxide superconductor on the substrate material will have superior superconducting characteristics.

Furthermore, using the above-described substrate material for the intermediate layer between an oxide superconductor and a semiconductor, it is possible to prepare a good semiconductor on the intermediate layer.

Also, because there exists the intermediate layer between an oxide superconductor and a semiconductor, the oxide superconductor and the semiconductor do not react with each other, and a good semiconductor can be prepared on the above-mentioned intermediate layer.

Two major requirements on a substrate material for producing superior superconducting film are: 1) lattice matching, and (2) chemical stability. The present invention focuses on the first aspect, i.e., the matching of lattices at temperatures for film formation and involves such factors as crystalline structures, lattice constants, thermal expansion coefficients, and phase transition.

As a substrate material which is superior to conventional materials, such as SrTiO3 and LaAlO3 and LaAlO3, in lattice matching, a single crystal of LaGaO3 was introduced, and the importance of lattice matching was recognized. However, a significant deficiency in LaGaO3 became clear. When this substrate is heated to a temperature of more than 150° C. a structural phase transition occurs, and upon cooling down to room temperature or less, steps form on the substrate because of the phase transition from the rhombohedral phase to the orthorhombic phase. These steps cause discontinuities in the film formed over the substrate, and degrade the quality of the formed film. These findings are reported in S. Miyazawa, Appl. Phys. Lett., 55, 2230 (1989) and H. M. O'Bryan et al., J. Mater. Res., 5, 183 (1990).

A substrate material for preparing an oxide superconductor in accordance with this invention comprises a mixed crystal material made up of Nd, La, Ga, and O in an atomic ratio of La$_{1-x}$Nd$_x$GaO$_3$ wherein $0.2 \leq x < 1.0$, said substrate material forming a GdFeO$_3$-type structure.

A structure material for preparing an oxide superconductor in accordance with the invention also comprises a mixed crystal material made of Nd, A$^1$, Ga, and O in an atomic ratio of A$^1{}_{1-x}$Nd$_x$GaO$_3$ where A$^1$ is a rare earth element excluding La and Nd, and $0.2 \leq x < 1.0$, said mixed crystal material forming a GdFeO$_3$-type structure.

BRIEF DESCRIPTION OF THE DRAWINGS

The invention will now be described in detail with reference to the accompanying drawings, wherein.

DETAILED DESCRIPTION OF PREFERRED EMBODIMENTS

Figure 1:
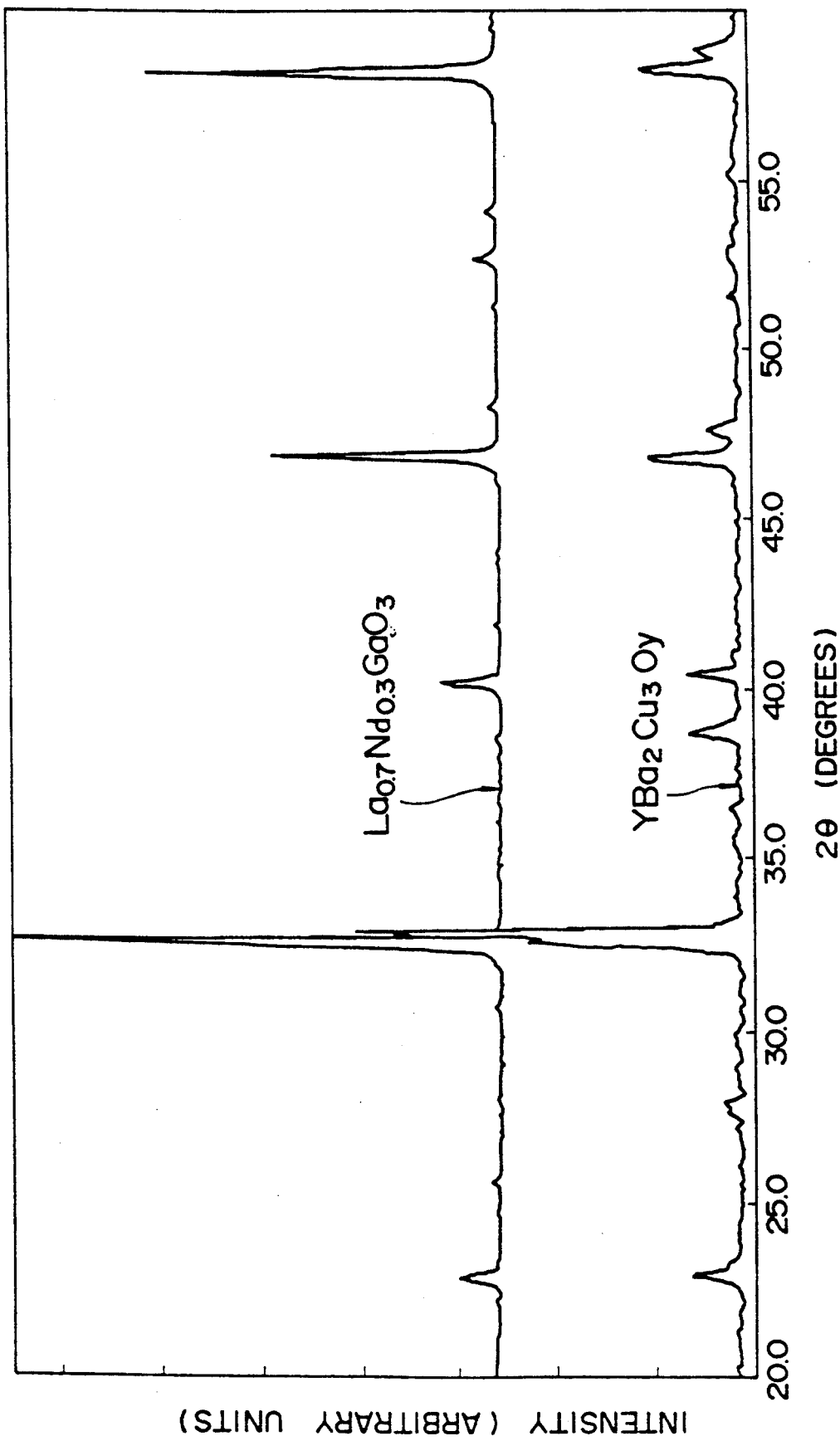
FIG. 1 is a graphical showing of powder x-ray diffraction patterns for the substrate material of La$_{0.7}$Nd$_{0.3}$GaO$_3$ for the preparation of an oxide superconductor and the oxide superconductor of YBa$_2$Cu$_3$O$_y$ in embodiment 1 of the invention.

In describing the embodiments, the same reference numerals will be used for parts with the same function to omit repetition of describing numerals.

Embodiment 1

First, as a double oxide which is an ingredient for an oxide superconductor substrate, a mixed crystal material of $A'1-xA''xGaO_3$ was prepared by powder mixing. In the preparation of this $A'1-xA''xGaO_3$ mixed crystal material, $Y_2O_3$, $Ln_2O_3$ (Ln=Nd, Gd, or Ho), and $Ga_2O_3$ were used as ingredients.

Next, the mixed crystal powder of $A'1-xA''xGaO_3$ prepared as described above and an oxide superconductor powder of YBaCuO type were mixed with each other at a weight ratio of 1 to 1, and the reactivity between the $A'1-xA''xGaO_3$ mixed crystal powder and the YBaCuO oxide superconductor powder was evaluated under high temperatures. This oxide superconductor of YBaCuO type can be, for example, $YBa_2Cu_3O_y$ (y being approximately 7), $YBa_2Cu_4O_w$ (w being approximately 8), $LnBa_2Cu_3O_y$ (Ln being Nd, Pm, Gd, Dy, Ho, Er, Tm, or the like), or the like. FIG. 1 shows a powder x-ray diffraction pattern for each of $YBa_2Cu_3O_y$ and $La_{0.7}Nd_{0.3}GaO_3$, which are examples of the above-described mixed crystal powder of $A'1-xA''xGaO_3$.

Figure 2:
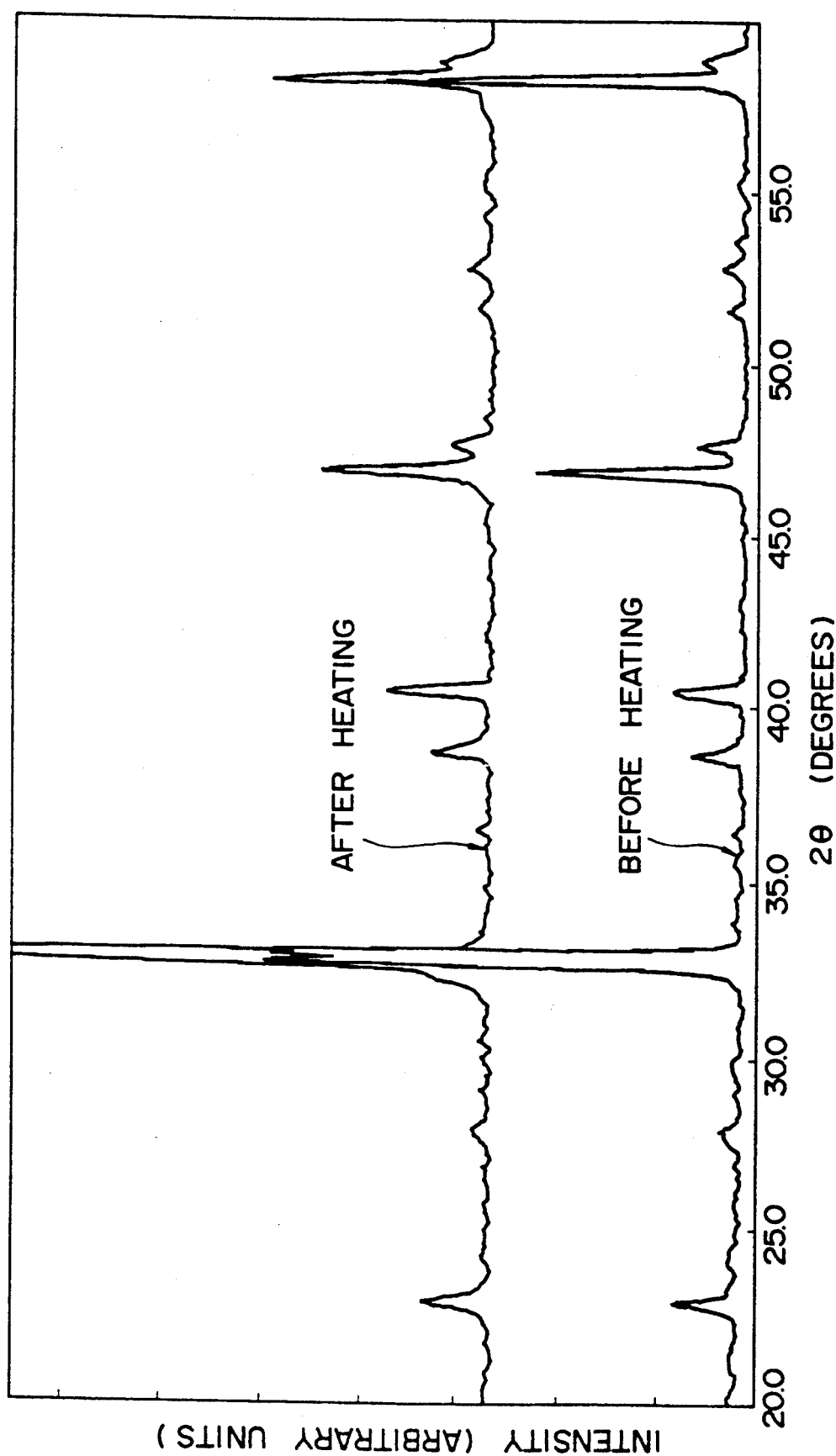
FIG. 2 is a graphical showing of x-ray diffraction patterns of a powder mixture of the substrate material La$_{0.7}$Nd$_{0.3}$GaO$_3$ and the oxide superconductor YBa$_2$Cu$_3$O$_y$ before and after heating.

As an example of reactivity evaluation, FIG. 2 shows the results obtained when a powder mixture of $YBa_2Cu_3O_y$ and a mixed crystal powder of $La_{0.7}Nd_{0.3}GaO_3$ was heated at 900° C. for one hour. FIG. 2 shows x-ray diffraction patterns of a powder mixture before and after heating at 900° C. Because the distribution of positions of diffraction peaks remained the same and no new peaks were observed before and after the heating, the $La_{0.7}Nd_{0.3}GaO_3$ mixed crystal powder and the $YBa_2Cu_3O_y$ were found not to react with each other. Also, the similar results were obtained for mixed crystal powders with different compositions.

Also, Table 2 shows the lattice constants of each mixed crystal powder obtained by powder x-ray diffraction.

As shown in Table 2, compositions 3 and 4 are mixed crystals between compositions 1 and 2 and are composed of a single phase. Also, the values of the lattice constants of these compositions 3 and 4 fall between those of the above-mentioned compositions 1 and 2. Therefore, by selecting a suitable composition it is possible to set lattice constants at will in a range of 5.43 to 5.50Å for a, 5.50 to 5.53Å for b, and 7.72 to 7.78Å for c to suit a given purpose.

Figure 4:
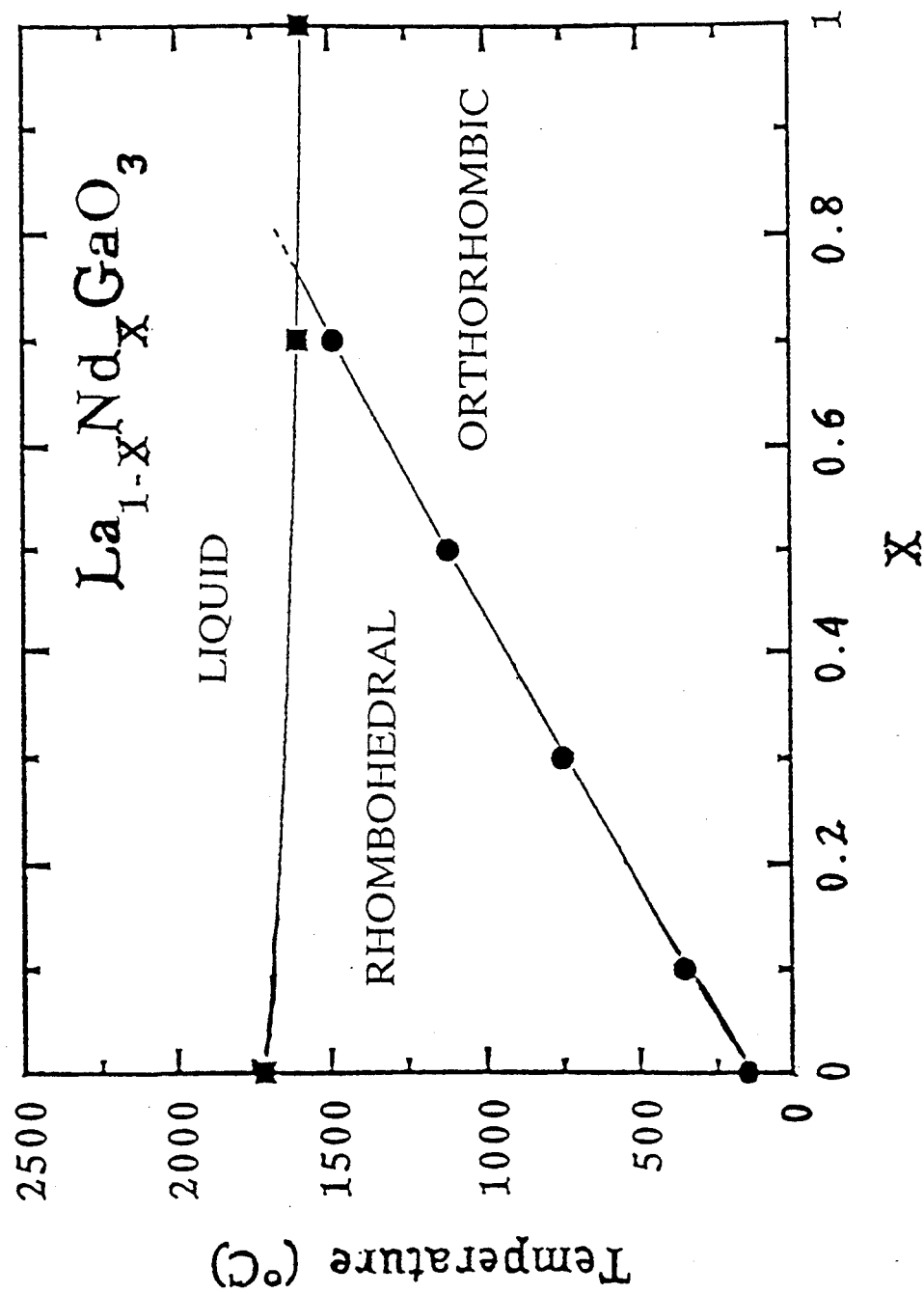
FIG. 4 shows a phase diagram for pseudo-binary system of $LaGaO_3$-$NdGaO_3$ obtained from thermal analysis and x-ray diffraction experiments carried in accordance with the invention.

The mixed crystal ratio x should be equal to or more than 0.20 and less than 1.0, preferably equal to or more than 0.30 and less than 1.0. These ranges are chosen in view of the phase diagram shown in FIG. 4 and the temperature range of 550° C. to 750° C. suitable for film formation. That is, within this range of x values, the phase transition from rhombohedral to orthorhombic does not occur after the film formation and undesirable discontinuities resulting from this phase transition can be avoided. Also, the article referred to above entitled Thermal Analysis of Rare Earth Gallates and Aluminates (H. M. O'Bryan et al., J. Mater. Res., vol. 5, No. 1, pp. 183–189) discloses the fact that $LaGaO_3$ crystal undergoes a phase transition between orthorhombic and rhombohedral structures at a temperature of about 145° C. (see FIGS. 1 and 2, and the last paragraph on page 184) and that $NdGaO_3$ crystal is orthorhombic from 25° C. and up to 1000° C. (see TABLE 1). The phase diagram of FIG. 4 shows the stable phases and phase transition temperatures for various mixed crystal compositions between $LaGaO_3$ and $NdgaO_3$. Accordingly, compositions Nos. 3 and 4 in Table 2 of the present application have a single phase of orthorhombic structure.

In addition, compositions 5 to 8 have different elements which form a substitution solid solution with different mixing ratios. In each case of these compositions 5 to 8, a perovskite compound of a single phase was also obtained, and it was possible to obtain substrate materials with different lattice constants.

Furthermore, other than those rare earth elements in the IIIa group mentioned above if a rare earth element belonging to the IIIa group with a suitable ionic radius for a given set of lattice constants is chosen, it is also possible to select lattice constants which have not been described above.

As clearly seen from Table 2 and the above-mentioned Table 1, the lattice constants of the substrate materials of embodiment 1 of the present invention are closer to the lattice constants of the oxide superconductors compared to the conventional substrate material.

Figure 3:
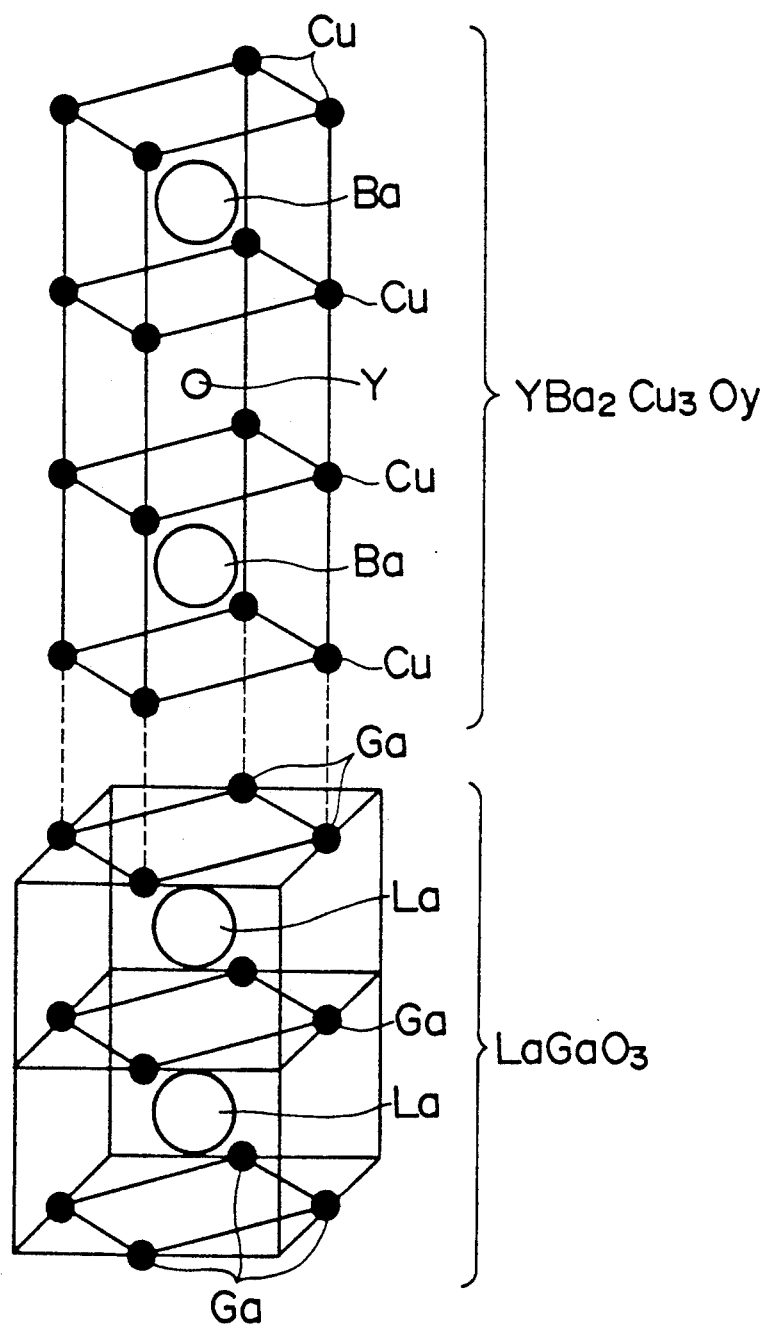
FIG. 3 is a diagram of a unit crystal structure of the oxide superconductor $YBa_2Cu_3O_y$ and the perovskite-type compound $LaGaO_3$.

As can be understood from what is described above, according to embodiment 1 of the present invention, rare earth elements belonging to the IIIa group at the La sites in FIG. 3 mentioned above can be replaced by other rare earth elements in the IIIa group having similar characteristics, but having a different ionic radius. Therefore, while maintaining the crystal structure, substrate materials with different lattice constants can be obtained. Thus the superconducting characteristics of an oxide superconductor can be improved by artificially changing lattice constants which are normally inherent to each material so as to reduce mismatching due to differences in the lattice constants of an oxide superconductor and a substrate material.

In these examples of the invention, the definition of the crystal structure as a certain perovskite-type is replaced by a $GdFeO_3$-type structure which is known to be orthorhombic and perovskite-type at the same type. International Series of Monographs in Solid Sate Physics, vol. 7, STRUCTURE AND PROPERTIES OF INORGANIC SOLIDS, by Francis S. Galasso, United Aircraft Research Laboratories, Pergamon Press, Ltd., Oxford, England, 1970, and the corresponding Japanese version "Sukai - Fainseraminkkusu No Kessho Kaguku - Muki Kotai Kagoubutu No Kozo To Seishitsu - (Illustrated Crystal Chemistry of Fine Ceramics - Structure and Properties of Inorganic Solids-)" published by K. K. Agune Gijutsu Center, Tokyo, Japan, pp. 197–200.

An example of this invention is a substrate material for preparing an oxide superconductor comprising:
  a mixed crystal material made up of Nd, La, Ga, and O in an atomic ratio of $La_{1-x}Nd_xGaO_3$ wherein $0.2 \leq x < 1.0$, the substrate material forming a $GdFeO_3$-type structure.

A further example of the invention is a substrate material for preparing an oxide superconductor comprising:

a mixed crystal material made up of Nd, $A^1$, Ga, and O in an atomic ratio of $A^1_{1-x}Nd_xGaO_3$ where $A^1$ is a rare earth element excluding La and Nd, and $0.2 \leq x < 1.0$, the mixed crystal material forming a $GdFeO_3$-type structure.

Embodiment 2

A film of $Nd_{0.88}Ho_{0.12}GaO_3$ with a thickness of 1420Å was formed on an Si substrate with a thickness of 0.5 mm by M.B.E. Nd, Ho, and $Ga_2O_3$ were used as the source of vapor in M.B.E. The temperature of film formation was about 740° C.

Next, an oxide superconductor film of YBaCuO type with a thickness of 7500Å was formed on the above-described mixed crystal film of $Nd_{0.88}Ho_{0.12}GaO_3$ by M.B.E. The temperature of film formation was about 740° C. Also, in the atmosphere during the film formation, oxidizing gases had a partial pressure of $2 \times 10^{-5}$ Torr near the substrate.

The electronic resistance of the oxide superconductor obtained after the film formation was measured by a direct-current four terminals method, and its critical temperature was measured. The critical temperature (Tc) thus obtained was 86K, and it is in no way inferior to an oxide superconductor prepared on a conventional substrate material.

As we can see from what has been described above, according to the method of preparing an oxide superconductor of embodiment 2 of the present invention, because there exists the above-described substrate material between a superconductor film and a Si substrate, even under the high temperature conditions for the formation of an oxide superconductor film by M.B.E. the oxide superconductor and the Si substrate do not react with each other. Therefore, it is possible to prepare an oxide superconductor with good superconducting characteristics.

Also, by taking thermal expansion into consideration when selecting suitable values for the lattice constants of a substrate material, even under the high temperature conditions for the formation of an oxide superconducting film by M.B.E. or high frequency spattering, mismatching between the oxide superconductor and the substrate material is reduced. Thus an oxide superconductor film with superior superconducting characteristics can be obtained.

In addition, by composing an intermediate layer between the oxide superconductor film and the Si or GaAs substrate from the above-described substrate material, it is possible to improve the superconducting characteristics of the oxide superconductor film prepared on the intermediate layer.

Furthermore, because a multiple of the lattice constants of a unit cell of the above-described substrate material or the multiple times the square root of 2 is close to a lattice constant of Si or GaAs, the insulator substrate for S.O.I. can be made of the substrate material so that a good epitaxial film is prepared on the insulator layer.

,Also, by composing an intermediate layer of the above-described substrate material between the oxide superconductor and the semiconductor, a good semiconductor can be prepared on the intermediate layer.

Moreover, because there exists an intermediate layer between an oxide superconductor and a semiconductor, the oxide superconductor and the semiconductor do not react with each other, and a good semiconductor can be prepared on the intermediate layer.

Having described the present invention as related to the embodiments, it should be noted that the present invention is by no means restricted by these embodiments. Variation and modification are possible within the scope of the present invention.

As we have described above, according to the substrate material for the preparation of an oxide superconductor of the present invention, it is possible to improve the superconducting characteristics of an oxide superconductor prepared on the substrate material.

Also, according to the method for the preparation of a semiconductor on a substrate material of the present invention, a good semiconductor can be prepared on the substrate material.

In addition, according to the method of the present invention for the preparation of an oxide superconductor on a semiconductor substrate with an intermediate layer there-between, it is possible to improve the superconducting characteristics of the above-mentioned oxide superconductors.

Furthermore, according to the method of the present invention for the preparation of an oxide superconductor on a semiconductor substrate with an intermediate layer there-between, a good semiconductor can be prepared on the intermediate layer.

TABLE 1

|  | MATERIAL | CRYSTAL SYSTEM AND TYPE | LATTICE CONSTANTS (Å) a | b | c |
| --- | --- | --- | --- | --- | --- |
| SUBSTRATE | MgO | CUBIC/ROCK SALT TYPE | 4.21 | — | — |
|  | $ZrO_2$ (Y S Z) | CUBIC/FLUORITE TYPE | 5.14 | — | — |
|  | $MgAl_2O_4$ | CUBIC/SPINEL TYPE | 8.08 | — | — |
|  | $SrTiO_3$ | CUBIC/PEROVSKITE TYPE | (3.91) 5.53* | — | — |
|  | $LaAlO_3$ | HEXAGONAL/PEROVSKITE TYPE | 5.37 | — | 13.11 |
|  | $LaGaO_3$ | ORTHORHOMBIC/PEROVSKITE TYPE | 5.50 | 5.53 | 7.78 |
| OXIDE SUPERCONDUCTOR | Y $Ba_2Cu_3O_y$ | ORTHORHOMBIC/PEROVSKITE TYPE | (3.82) 5.40* | (3.89) 5.50* | 11.68 |
|  | $Bi_2Sr_2CaCu_2O_y$ | ORTHORHOMIC/PEROVSKITE TYPE | 5.40 | 5.40 | 30.64 |
| SEMICONDUCTOR | Si | CUBIC/DIAMOND TYPE | 5.43 | — | — |
|  | GaAs | CUBIC/DIAMOND TYPE | 5.65 | — | — |

TABLE 2

| | No. | COMPOSITION (MOL RATIO) | | | | | | SINGLE PHASE? | LATTICE CONSTANTS (Å) | | |
| --- | --- | --- | --- | --- | --- | --- | --- | --- | --- | --- | --- |
| | | La | Nd | Ho | Gd | Y | Ga | | a | b | c |
| COMPARATIVE EXAMPLE | 1 | 1.0 | — | — | — | — | 1.0 | YES | 5.50 | 5.53 | 7.78 |
| | 2 | — | 1.0 | — | — | — | 1.0 | YES | 5.43 | 5.50 | 7.72 |
| EMBODIMENT 1 | 3 | 0.7 | 0.3 | — | — | — | 1.0 | YES | 5.49 | 5.51 | 7.78 |
| | 4 | 0.3 | 0.7 | — | — | — | 1.0 | YES | 5.45 | 5.51 | 7.77 |
| | 5 | 0.9 | — | 0.1 | — | — | 1.0 | YES | 5.50 | 5.53 | 7.78 |
| | 6 | 0.8 | — | — | 0.2 | — | 1.0 | YES | 5.51 | 5.49 | 7.78 |
| | 7 | — | 0.95 | 0.05 | — | — | 1.0 | YES | 5.43 | 5.49 | 7.72 |
| | 8 | — | 0.97 | — | — | 0.03 | 1.0 | YES | 5.42 | 5.50 | 7.71 |

We claim:

1. A substrate material for preparing an oxide superconductor comprising:

a mixed crystal material made up of Nd, $A^1$, Ga, and O in an atomic ratio of $A^1_{1-x}Nd_xGaO_3$ where $A^1$ is a rate earth element excluding La and Nd, and $0.2 \leq x < 1.0$, said mixed crystal material forming a $FdFeO_3$-type structure.

* * * * *